(12) United States Patent
Wang

(10) Patent No.: US 10,680,033 B2
(45) Date of Patent: Jun. 9, 2020

(54) CHIP PACKAGING METHOD AND CHIP PACKAGE

(71) Applicant: China Wafer Level CSP Co., Ltd., Suzhou, Jiangsu (CN)

(72) Inventor: Zhiqi Wang, Jiangsu (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 16/107,632

(22) Filed: Aug. 21, 2018

(65) Prior Publication Data

US 2019/0189675 A1    Jun. 20, 2019

(30) Foreign Application Priority Data

Dec. 15, 2017   (CN) .......................... 2017 1 1346047
Dec. 15, 2017   (CN) ...................... 2017 2 1752853 U

(51) Int. Cl.
| | |
|---|---|
| *H01L 27/146* | (2006.01) |
| *H01L 31/0203* | (2014.01) |
| *H01L 25/04* | (2014.01) |
| *H01L 31/02* | (2006.01) |
| *H01L 31/0232* | (2014.01) |

(52) U.S. Cl.
CPC ...... *H01L 27/14685* (2013.01); *H01L 25/042* (2013.01); *H01L 27/14618* (2013.01); *H01L 27/14625* (2013.01); *H01L 27/14634* (2013.01); *H01L 27/14636* (2013.01); *H01L 31/0203* (2013.01); *H01L 31/02005* (2013.01); *H01L 31/02325* (2013.01)

(58) Field of Classification Search
CPC ..................... H01L 27/14625; H01L 27/14685
See application file for complete search history.

(56) References Cited

U.S. PATENT DOCUMENTS

2018/0108585 A1*   4/2018   Wang .................. H01L 23/3185

* cited by examiner

*Primary Examiner* — Quoc D Hoang
(74) *Attorney, Agent, or Firm* — Wolf, Greenfield & Sacks, P.C.

(57) ABSTRACT

A chip packaging method and a chip package are provided. According to the chip packaging method and the chip package, to-be-packaged chips are located in a plastic packaging layer, and front surfaces of the to-be-packaged chips are flush with a first surface of the plastic packaging layer, and the plastic packaging material for manufacturing the plastic packaging layer has good plasticity before a curing process, so that the formed first surface and the second surface have good smoothness, thereby ensuring the reliability of the package.

25 Claims, 15 Drawing Sheets

CHIP PACKAGING METHOD AND CHIP PACKAGE

The present application claims priorities to Chinese Patent Application No. 201711346047.3, titled "CHIP PACKAGING METHOD AND CHIP PACKAGE", filed on Dec. 15, 2017 with the State Intellectual Property Office of People's Republic of China and Chinese Patent Application No. 201721752853.6, titled "CHIP PACKAGE", filed on Dec. 15, 2017 with the State Intellectual Property Office of People's Republic of China, both of which are incorporated herein by reference in their entireties.

FIELD

The present disclosure relates to the technical field of semiconductor processes, and in particular to a chip package and a chip packaging method.

BACKGROUND

With the continuous development of technology, more and more electronic devices are widely used in people's daily life and work and bring great convenience to people's daily life and work, and these electronic devices become indispensable important tools to people currently. In the electronic devices, various functions can be achieved by various chips. In order to ensure service life and safe stable operation of the chip, a packaging process needs to be performed on the chip to form a chip package, so as to protect the chip.

In the conventional technology, the chip package formed by performing the packaging process on a chip has poor smoothness, resulting in poor reliability of the chip package.

SUMMARY

In order to solve the above problems, there are provided with a chip packaging method and a chip package in technical solutions of the present disclosure, so that the formed chip package has good smoothness, thereby ensuring the reliability of the chip package.

In order to achieve the above objects, the following technical solutions are provided in the present disclosure.

A chip packaging method is provided, which includes: providing at least one to-be-packaged chip, where the to-be-packaged chip includes a front surface and a back surface opposite to each other, and the front surface of the to-be-packaged chip is provided with a sensing unit and contact pads connected to the sensing unit; forming a plastic packaging layer covering the back surface of the to-be-packaged chip, where the plastic packaging layer includes a first surface and a second surface opposite to each other, the to-be-packaged chip is located in the plastic packaging layer, and the front surface of the to-be-packaged chip is flush with the first surface; and forming an interconnection structure corresponding to the to-be-packaged chip on the second surface of the plastic packaging layer, where the contact pad is connected to an external circuit via the interconnection structure.

In an embodiment, in a case that multiple to-be-packaged chips are provided, front surfaces of the to-be-packaged chips are located on a same plane and are flush with the first surface, and multiple interconnection structures in a one-to-one correspondence with the to-be-packaged chips are formed, the chip packaging method further includes: dividing the plastic packaging layer into multiple packages by a cutting process. Each of the packages includes at least one of the to-be-packaged chips and the interconnection structure corresponding to the at least one of the to-be-packaged chips.

In an embodiment, forming the plastic packaging layer covering the back surfaces of the to-be-packaged chips includes: providing a carrier plate having a temporary bonding surface for mounting the to-be-packaged chips; attaching the front surfaces of the to-be-packaged chips to the temporary bonding surface of the carrier plate; and forming the plastic packaging layer, where the plastic packaging layer covers the to-be-packaged chips and the temporary bonding surface of the carrier plate.

In an embodiment, the temporary bonding surface of the carrier plate is provided with multiple mounting grooves, each of the mounting grooves is configured to receive one of the to-be-packaged chips, there is a gap between two adjacent mounting grooves, and the mounting grooves have a same depth less than a thickness of the to-be-packaged chip. The attaching the front surfaces of the to-be-packaged chips to the temporary bonding surface of the carrier plate includes: placing one of the to-be-packaged chips in each of the mounting grooves, with the front surfaces of the to-be-packaged chips being opposite to bottoms of the mounting grooves.

In an embodiment, the forming the plastic packaging layer includes: forming a first plastic packaging layer, where the first plastic packaging layer covers the to-be-packaged chips and the temporary bonding surface of the carrier plate, and a surface of the first plastic packaging layer facing away from the to-be-packaged chips serves as the second surface; removing the carrier plate; and forming a second plastic packaging layer on a surface of the first plastic packaging layer exposing the front surfaces of the to-be-packaged chips, where a surface of the second plastic packaging layer facing away from the first plastic packaging layer serves as the first surface.

In an embodiment, the forming a second plastic packaging layer on a surface of the first plastic packaging layer exposing the front surfaces of the to-be-packaged chips includes: forming a protection layer on the front surfaces of the to-be-packaged chips; forming the second plastic packaging layer, where a thickness of the second plastic packaging layer is greater than a height of a part of the to-be-packaged chip outside of the first plastic packaging layer; removing the protection layer; and thinning the second plastic packaging layer on a surface of the second plastic packaging layer facing away from the first plastic packaging layer, to cause the surface of the second plastic packaging layer facing away from the first plastic packaging layer to be flush with the front surfaces of the to-be-packaged chips.

In an embodiment, the temporary bonding surface is a plane, and the attaching the front surfaces of the to-be-packaged chips to the temporary bonding surface of the carrier plate includes: attaching and fixing the to-be-packaged chips to the temporary bonding surface with a temporary adhesive film having a uniform thickness.

In an embodiment, the chip packaging method further includes: removing the carrier plate after forming the plastic packaging layer and before forming the interconnection structures; or removing the carrier plate after forming the interconnection structures and before performing the cutting process.

In an embodiment, forming interconnection structures corresponding to the to-be-packaged chips on the second surface of the plastic packaging layer includes: forming a patterned metal wire layer on the second surface of the plastic packaging layer. The metal wire layer includes the multiple interconnection structures in a one-to-one correspondence with the to-be-packaged chips. Solder bumps are formed on surfaces of the interconnection structures, and the solder bumps are connected to the external circuit.

In an embodiment, the forming a patterned metal wire layer on the second surface of the plastic packaging layer includes: forming a metal wire layer covering the second surface of the plastic packaging layer; and etching and patterning the metal wire layer, to form the multiple interconnection structures in a one-to-one correspondence with the to-be-packaged chips.

In an embodiment, the forming a patterned metal wire layer on the second surface of the plastic packaging layer includes: forming the patterned metal wire layer with a mask having a predetermined pattern structure by an evaporation process.

In an embodiment, before performing the cutting process, the chip packaging method further includes: forming through holes penetrating the first surface and the second surface of the plastic packaging layer; and connecting the contact pad to one end of a metal wire, and connecting the other end of the metal wire to the interconnection structure via the through hole, where the through hole is not overlapped with the to-be-packaged chip in a first direction that is perpendicular to the first surface and the second surface of the plastic packaging layer.

In an embodiment, the back surface of each of the to-be-packaged chips is provided with a solder pad connected to the contact pad. Before forming the metal wire layer, the chip packaging method further includes: forming through holes on the second surface of the plastic packaging layer, with the through hole being directly opposite to the solder pad in a first direction to expose the solder pad. The interconnection structure is connected to the solder pad via the through hole. The first direction is perpendicular to the first surface and the second surface of the plastic packaging layer.

In an embodiment, before forming the metal wire layer, the chip packaging method further includes: forming first through holes penetrating the plastic packaging layer; and forming second through holes penetrating the front surfaces and the back surfaces of the to-be-packaged chips in the first through holes, with the second through hole being directly opposite to the contact pad in a first direction to expose the contact pad. The metal wire layer is connected to the contact pad via the first through hole and the second through hole. The first direction is perpendicular to the first surface and the second surface of the plastic packaging layer.

In an embodiment, before performing the cutting process, the chip packaging method further includes: forming an insulating protection layer covering the metal wire layer. A surface of the insulating protection layer is provided with openings for receiving the solder bumps.

In an embodiment, the to-be-packaged chip is an image sensing chip. After completing a cutting process, the chip packaging method further includes: fixing a bracket on the periphery of the first surface of the plastic packaging layer by using the plastic packaging layer of a package as a substrate; and providing a transparent cover plate on the bracket.

A chip package is provided, which includes a plastic packaging layer, at least one to-be-packaged chip in the plastic packaging layer and an interconnection structure. The plastic packaging layer includes a first surface and a second surface opposite to each other. The to-be-packaged chip includes a front surface and a back surface opposite to each other, the front surface of the to-be-packaged chip is provided with a sensing unit and contact pads connected to the sensing unit, and the front surface of the to-be-packaged chip is flush with the first surface. The interconnection structure is corresponding to the to-be-packaged chip and is provided on the second surface of the plastic packaging layer. The contact pad is connected to an external circuit via the interconnection structure.

In an embodiment, multiple to-be-packaged chips are provided in the plastic packaging layer. Front surfaces of the to-be-packaged chips are located on a same plane and are flush with the first surface. Multiple interconnection structures in a one-to-one correspondence with the to-be-packaged chips are formed.

In an embodiment, the plastic packaging layer includes a first plastic packaging layer and a second plastic packaging layer. The first plastic packaging layer is provided with multiple grooves in a one-to-one correspondence with the to-be-packaged chips, a depth of the groove is less than a thickness of the to-be-packaged chip, and the back surfaces of the to-be-packaged chips are directly opposite to bottoms of the grooves. A surface of the first plastic packaging layer facing away from the to-be-packaged chips serves as the second surface. The second plastic packaging layer covers a surface of the first plastic packaging layer facing towards the to-be-packaged chips, and a surface of the second plastic packaging layer facing away from the first plastic packaging layer serves as the first surface.

In an embodiment, the interconnection structures are located on a same patterned metal wire layer; and solder bumps are formed on surfaces of the interconnection structures, and the solder bumps are connected to the external circuit.

In an embodiment, the plastic packaging layer is provided with through holes penetrating the first surface and the second surface. The contact pad is connected to one end of a metal wire, and the other end of the metal wire is connected to the interconnection structure via the through hole. The through hole is not overlapped with the to-be-packaged chip in a first direction that is perpendicular to the first surface and the second surface of the plastic packaging layer.

In an embodiment, the back surface of each of the to-be-packaged chips is provided with a solder pad connected to the contact pad. The second surface of the plastic packaging layer is provided with through holes, with the through hole being directly opposite to the solder pad in a first direction to expose the solder pad. The first direction is perpendicular to the first surface and the second surface of the plastic packaging layer. The interconnection structure is connected to the solder pad via the through hole.

In an embodiment, the plastic packaging layer is provided with first through holes. The back surfaces of the to-be-packaged chips are provided with second through holes in a one-to-one correspondence with the first through holes, with the second through hole being directly opposite to the contact pad in a first direction to expose the contact pad. The metal wire layer is connected to the contact pad via the first through hole and the second through hole, and the first direction is perpendicular to the first surface and the second surface of the plastic packaging layer.

In an embodiment, an insulating protection layer is provided on the surfaces of the interconnection structures, and a surface of the insulating protection layer is provided with openings for receiving the solder bumps.

In an embodiment, the to-be-packaged chip is an image sensing chip.

In an embodiment, the first surface of the plastic packaging layer is further provided with a bracket, and a transparent cover plate is installed on the bracket.

It can be known from the above description that, in the chip packaging method and the chip package according to the technical solutions of the present disclosure, the to-be-packaged chips are located in the plastic packaging layer, and the front surfaces of the to-be-packaged chips are flush with the first surface of the plastic packaging layer, and the plastic packaging material for manufacturing the plastic packaging layer has good plasticity before a curing process, so that the formed first surface and the second surface have good smoothness, thereby ensuring the reliability of the chip package.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described hereinafter. It is apparent that, the drawings in the following description show only some embodiments of the present disclosure, and other drawings may be obtained by those skilled in the art from the provided drawings without creative efforts.

DETAILED DESCRIPTION OF EMBODIMENTS

Technical solutions in the embodiments of the present disclosure are clearly and completely described below with reference to the drawings in the embodiments of the present disclosure. It is apparent that the described embodiments are merely some embodiments of the present disclosure, rather than all the embodiments. All other embodiments obtained by those skilled in the art based on the embodiments of the present disclosure without creative efforts fall within the protection scope of the present disclosure.

Figure 1:
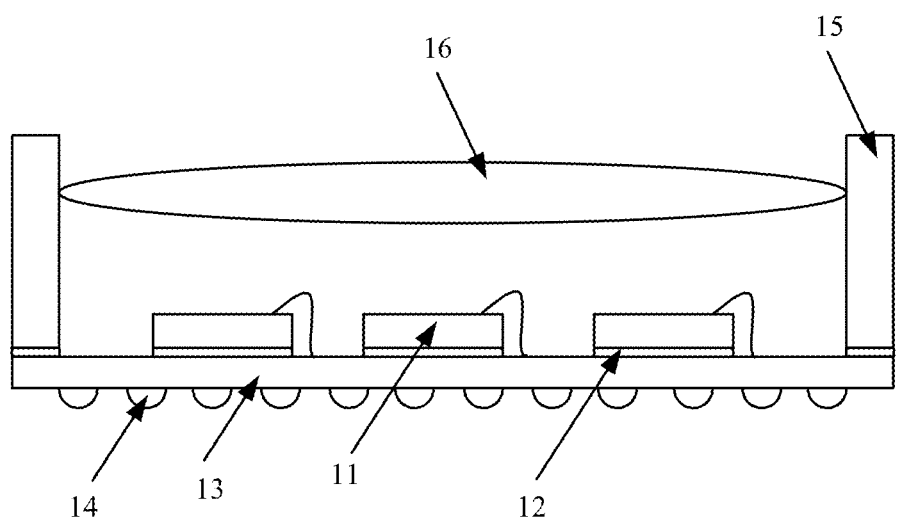
FIG. 1 is a schematic structural diagram of a multi-chip package in the conventional technology.

A package formed by packaging chips is generally shown in FIG. 1, which is a schematic structural diagram of a multi-chip package. In this chip package, chips 11 are bonded and fixed to a circuit board 13 by an adhesive layer 12. A surface of the circuit board 13 facing away from the chips 11 is provided with metal wires and solder bumps 14 connected to the metal wires, for connection to external circuits. The chip 11 is connected to the metal wire by a wire bonding process. A surface of the circuit board 13 on which the chips 11 are arranged is provided with a bracket 15 surrounding the chips 11. The bracket 15 is provided with a transparent cover plate 16. In a case that the chip 11 is an image sensing chip, the transparent cover plate 16 is a lens element.

In the embodiment shown in FIG. 1, the circuit board 13 used as a carrier plate for the chips 11 is bonded and fixed to the chips 11 by the adhesive layer 12, which cannot ensure smoothness of the chip package. Further, in a case that the multiple chips 11 are integrally packaged, height smoothness of the chips 11 cannot be ensured. When the bracket 15 is provided, since the bracket 15 needs to be connected to the circuit board 13 separately by the adhesive layer, a height of the bracket 15 relative to the chip 11 cannot be accurately determined. For the image sensing chip, a focal length of the lens element cannot be accurately determined. The above problems may result in poor reliability of the formed package.

In order to solve the above problems, a chip package and a packaging method are provided according to embodiments of the present disclosure. A chip is packaged by a plastic packaging layer. Since the plastic packaging material has good plasticity before curing, the formed package has good smoothness, ensuring the reliability of the package. Further, since the plastic packaging layer formed after the curing of the plastic packaging material has a good mechanical strength, the plastic packaging layer can be reused as a carrier plate for mounting a supporting member such as a bracket, through which a cover plate and other components are installed. In a case that the supporting member is provided by means of the plastic packaging layer, since the plastic packaging layer has good smoothness, the height of the supporting member relative to the chips can be accurately determined, effectively ensuring the reliability of the package.

In order to make the above objects, features, and advantages of the present disclosure more apparent, the present disclosure is further described below in detail in conjunction with the drawings and specific embodiments.

A chip packaging method is provided according to an embodiment of the present disclosure. The chip packaging method includes the following steps S1 to S3.

In step S1, at least one to-be-packaged chip is provided.

The to-be-packaged chip includes a front surface and a back surface opposite to each other. The front surface of the to-be-packaged chip is provided with a sensing unit and contact pads connected to the sensing unit.

In step S2, a plastic packaging layer covering the back surface of the to-be-packaged chip is formed.

The plastic packaging layer includes a first surface and a second surface opposite to each other. The to-be-packaged chip is located in the plastic packaging layer. The front surface of the to-be-packaged chip is flush with the first surface.

In step S3, an interconnection structure corresponding to the to-be-packaged chip is formed on the second surface of the plastic packaging layer. The contact pad is connected to an external circuit via the interconnection structure.

In the packaging method according to the embodiment of the present disclosure, the chip is directly packaged and protected by the plastic packaging layer, and the plastic packaging layer has a first surface and a second surface opposite to each other. The first surface and the second surface are planes and are parallel with each other. The front surface of the to-be-packaged chip is flush with the first surface.

The to-be-packaged chip can be packaged and protected by the plastic packaging layer. Further, the interconnection structure is directly provided on the surface of the plastic packaging layer to be connected to the contact pad. In this case, the plastic packaging layer is reused as a circuit board to facilitate connection between the to-be-packaged chip and an external circuit. In this way, as compared with the conventional method of fixing a chip to a circuit board by an adhesive layer, the plastic packaging layer functions as both the circuit board and the adhesive layer, which greatly simplifies the package. Since the plastic packaging layer has a large mechanical strength, a low thickness is required due to the large mechanical strength, which greatly reduces the thickness of the package.

In addition, the chip is packaged by the plastic packaging layer. Since the plastic packaging material has good plasticity before curing, the formed package has good smoothness, ensuring the reliability of the package. Further, since the plastic packaging layer formed after the curing of the plastic packaging material has a good mechanical strength, the plastic packaging layer can be reused as a carrier plate for mounting a supporting member such as a bracket, through which a cover plate and other components are installed. In a case that the supporting member is provided by means of the plastic packaging layer, since the plastic packaging layer has good smoothness, the height of the supporting member relative to the chips can be accurately determined, effectively ensuring the reliability of the package.

In a case that multiple chips are packaged in a same packaging process, the multiple to-be-packaged chips are provided. Front surfaces of the to-be-packaged chips are located on a same plane and are flush with the first surface. Each of the to-be-packaged chips corresponds to one interconnection structure. In this case, the chip packaging method further includes: dividing the plastic packaging layer into multiple packages by a cutting process. Each of the packages includes at least one of the to-be-packaged chips and the interconnection structure corresponding to the to-be-packaged chip.

In the case that multiple chips are packaged in a same packaging process, the chip packaging method is shown in FIGS. 2a to 5c.

Reference is made to FIGS. 2a to 5c, which show a schematic flowchart of a chip packaging method according to an embodiment of the present disclosure. The chip packaging method includes the following steps S11 to S14.

In step S11, multiple to-be-packaged chips are provided.

Figure 2A:
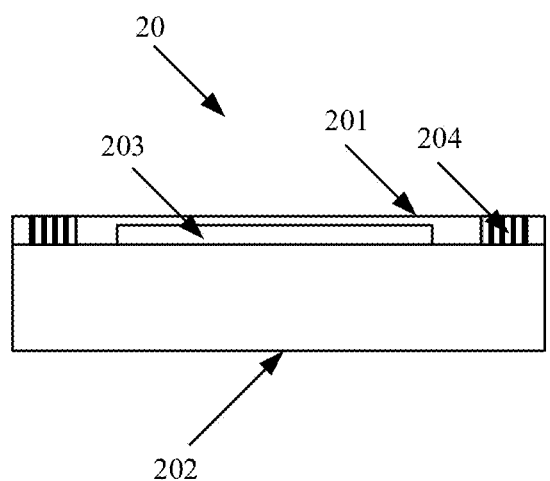
FIGS. 2a to 5c show a schematic flowchart of a chip packaging method according to an embodiment of the present disclosure.
Figure 2B:
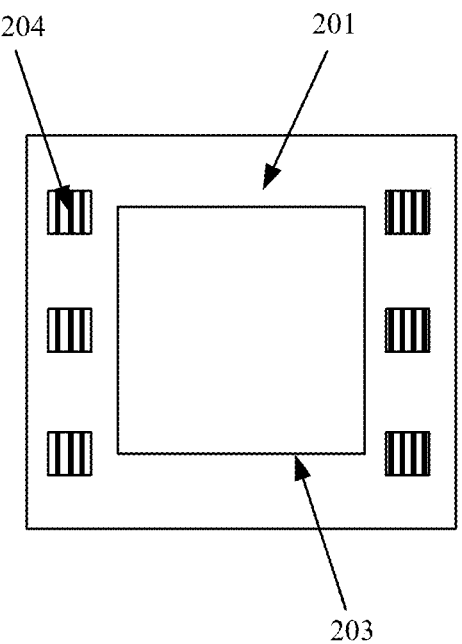

A structure of the to-be-packaged chip is shown in FIG. 2a and FIG. 2b. FIG. 2a is a sectional view of the to-be-packaged chip, and FIG. 2b is a top view of a front surface of the to-be-packaged chip. A to-be-packaged chip 20 includes a front surface 201 and a back surface 202 opposite to each other. The front surface 201 of the to-be-packaged chip 20 is provided with a sensing unit 203 and contact pads 204 connected to the sensing unit 203.

In FIGS. 2a and 2b, multiple contact pads 204 are arranged in two columns, and the sensing unit 203 is located between the two columns of contact pads 204. In other implementations, the multiple contact pads 204 may be evenly arranged on the periphery of the sensing unit 203, or the multiple contact pads 204 may be arranged on a same side of the sensing unit 203.

In the embodiment of the present disclosure, the number of the to-be-packaged chips 20 is not limited, and may be set based on design parameters for the package. The to-be-packaged chips 20 may be arranged in an array.

Figure 3:
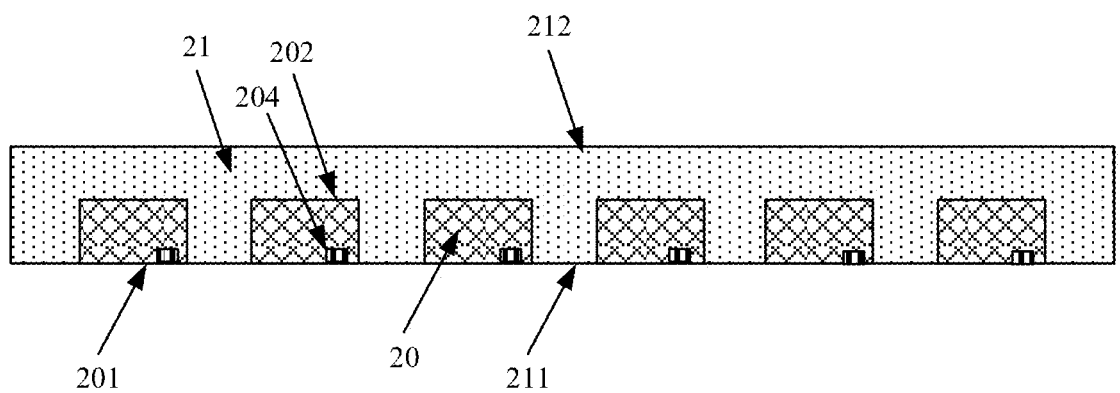

In step S12, as shown in FIG. 3, a plastic packaging layer 21 covering back surfaces of the to-be-packaged chips 20 is formed.

The front surfaces of the to-be-packaged chips 20 are located on a same plane. The plastic packaging layer 21 includes a first surface 211 and a second surface 212 opposite to each other. The to-be-packaged chips 20 are located in the plastic packaging layer 21, and the front surfaces 201 of the to-be-packaged chips 20 are flush with the first surface 211. There is a gap between two adjacent to-be-packaged chips 20, which facilitates a subsequent cutting process.

Figure 4:
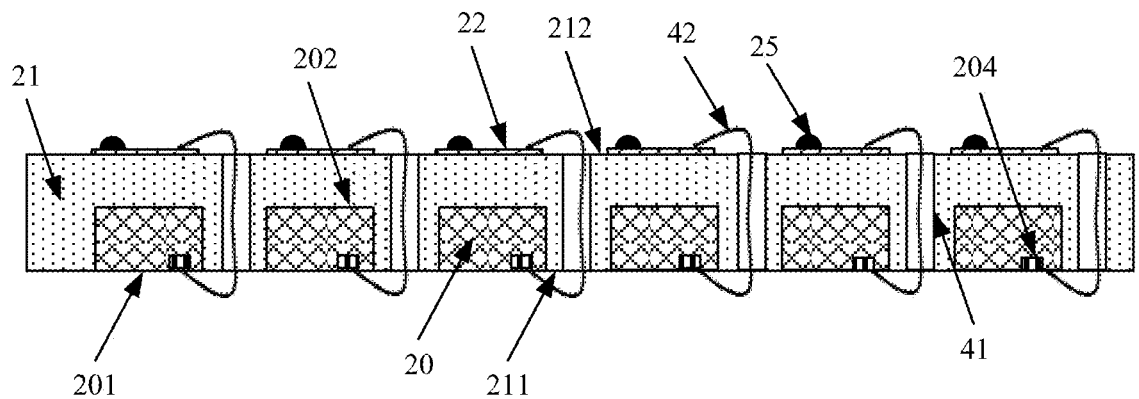

In step S13, as shown in FIG. 4, interconnection structures 22 corresponding to the to-be-packaged chips 20 are formed on the second surface 212 of the plastic packaging layer 21.

The contact pad 204 is connected to an external circuit via the interconnection structure 22. The plastic packaging layer 21 is provided with through holes 41. The contact pad 204 and the interconnection structure 22 may be connected by a wire located in the through hole 41, and may also be electrically connected in other manners.

In this step, the forming interconnection structures 22 corresponding to the to-be-packaged chips 20 on the second surface 212 of the plastic packaging layer 21 may be performed by forming a patterned metal wire layer on the second surface 212 of the plastic packaging layer 21. The metal wire layer includes multiple interconnection structures 22 in a one-to-one correspondence with the to-be-packaged chips 20. Solder bumps 25 are formed on surfaces of the interconnection structures 22. The solder bumps 25 are connected to the external circuit.

The forming a patterned metal wire layer on the second surface 212 of the plastic packaging layer 21 may be performed by steps including: forming a metal wire layer covering the second surface of the plastic packaging layer; and etching and patterning the metal wire layer, to form the multiple interconnection structures in a one-to-one correspondence with the to-be-packaged chips. Alternatively, the forming a patterned metal wire layer on the second surface 212 of the plastic packaging layer 21 may be performed by forming the patterned metal wire layer with a mask having a predetermined pattern structure by an evaporation process.

In an embodiment, before performing the cutting process, the chip packaging method further includes: forming an insulating protection layer covering the metal wire layer. A surface of the insulating protection layer is provided with openings for receiving the solder bumps. The insulating protection layer is not shown in FIG. 4.

Figure 5A:
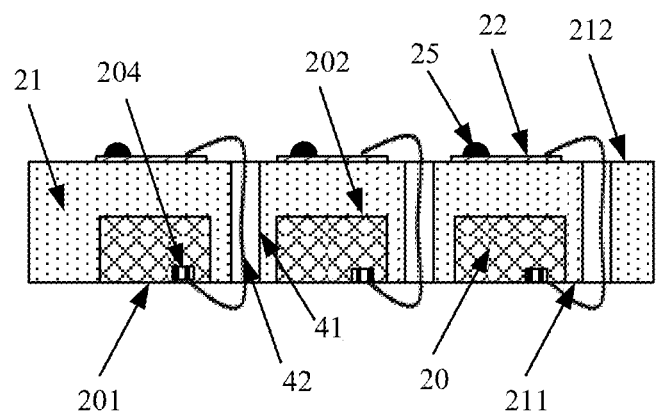
Figure 5B:
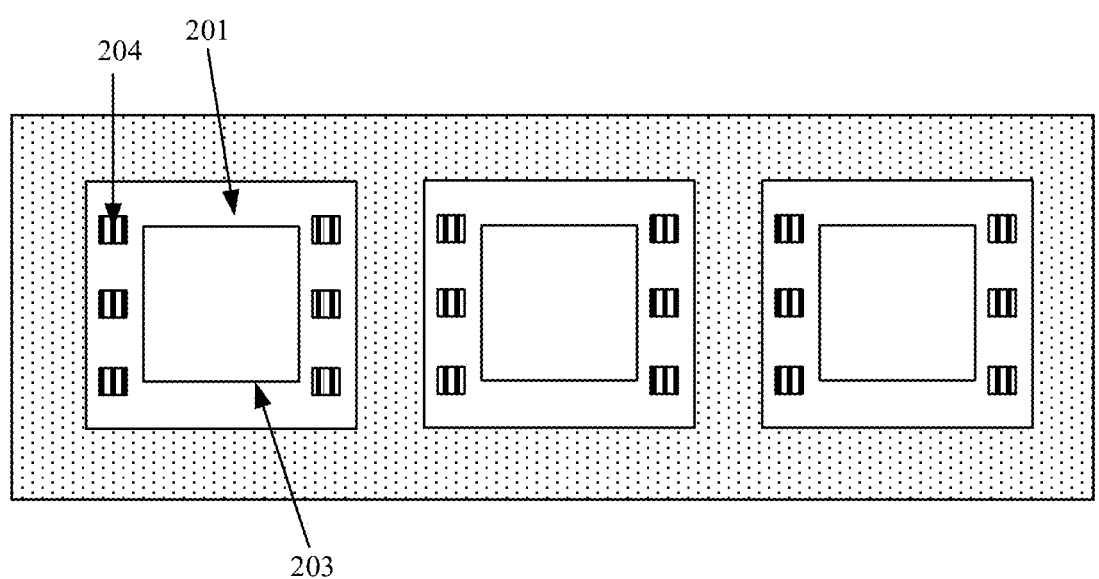

In step S14, as shown in FIGS. 5a and 5b, the plastic packaging layer 21 is divided into multiple packages by a cutting process.

The package may include multiple to-be-packaged chips 20 and multiple interconnection structures 22 corresponding to the multiple to-be-packaged chips 20, and may also include one to-be-packaged chip 20 and one interconnection structure 22 corresponding to the to-be-packaged chip 20. In a case that the package includes multiple to-be-packaged chips 20, the multiple to-be-packaged chips 20 may be arbitrarily arranged. For example, in the package, the multiple to-be-packaged chips 20 may be arranged in an array. The number of the to-be-packaged chips 20 is not limited in the embodiment of the present disclosure.

Figure 5C:
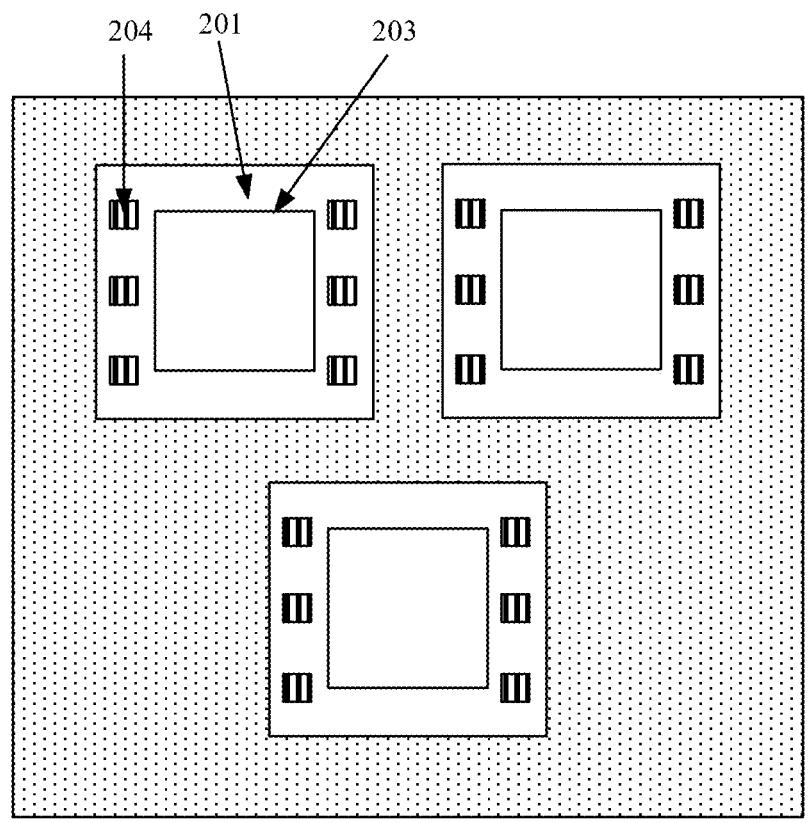

In FIG. 5a and FIG. 5b, each package includes three to-be-packaged chips 20, and the three to-be-packaged chips 20 are located on a same straight line. In other implementations, as shown in FIG. 5c, the three to-be-packaged chips 20 may also be located at three vertices of a triangle, respectively.

In the chip packaging method according to the embodiment of the present disclosure, the process of forming the plastic packaging layer 21 covering the back surfaces of the to-be-packaged chips 20 is shown in FIGS. 6 to 13, which show a flowchart of a method for forming a plastic packaging layer according to an embodiment of the present disclosure. The method for forming a plastic packaging layer includes the following steps S21 to S23.

Figure 6:
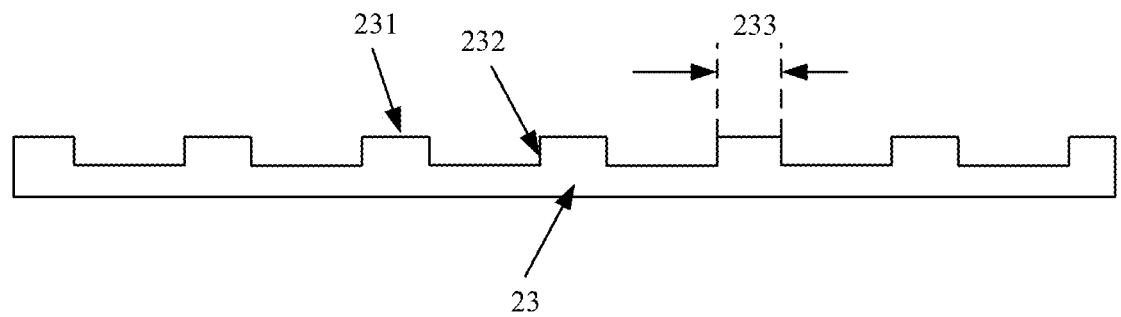
FIGS. 6 to 13 show a schematic flowchart of a method for forming a plastic packaging layer according to an embodiment of the present disclosure.

In step S21, as shown in FIG. 6, a carrier plate 23 is provided. The carrier plate has a temporary bonding surface 231 for mounting the to-be-packaged chips 20.

In this embodiment, the temporary bonding surface 231 of the carrier plate 23 is provided with multiple mounting grooves 232. Each of the mounting grooves 232 is configured to receive one of the to-be-packaged chips 20. There is a gap 233 between two adjacent mounting grooves 232. The mounting grooves 232 have a same depth less than a thickness of the to-be-packaged chip 20.

The carrier plate 23 may be a glass plate or a plastic plate. The carrier plate 23 has a plane, i.e., the temporary bonding surface 231. Depending on different materials of the carrier plate 23, the mounting groove 232 may be formed by an injection molding process or by an etching process.

Figure 7:
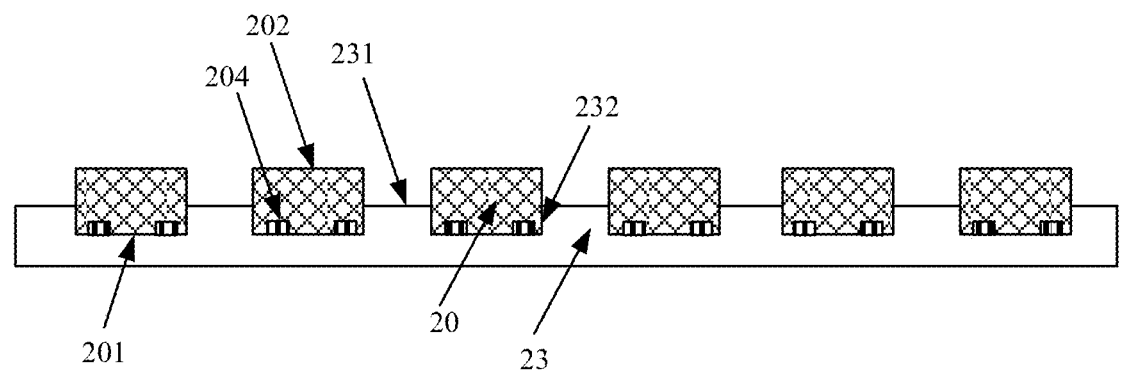

In step S22, as shown in FIG. 7, the front surfaces 201 of the to-be-packaged chips 20 are attached to the temporary bonding surface 231 of the carrier plate 23.

In the case that the carrier plate 23 with the mounting grooves 232 is used, in this step, the attaching the front surfaces 201 of the to-be-packaged chips 20 to the temporary bonding surface 231 of the carrier plate 23 may be performed by placing one of the to-be-packaged chips 20 in each of the mounting grooves 232, with the front surfaces 201 of the to-be-packaged chips 20 being opposite to bottoms of the mounting grooves 232. Since the mounting grooves 232 have a same depth, and the front surfaces of the to-be-packaged chips 20 are in seamless contact with the bottoms of the corresponding mounting grooves 232, the front surfaces 201 of the to-be-packaged chips 20 can be located on a same plane.

In step S23, as shown in FIGS. 8 to 13, the plastic packaging layer 21 is formed. The plastic packaging layer 21 covers the to-be-packaged chips 20 and the temporary bonding surface 231 of the carrier plate 23.

In the case that the carrier plate 23 with the mounting grooves 232 is used, in this step, the forming the plastic packaging layer 21 may be performed as follows.

Figure 8:
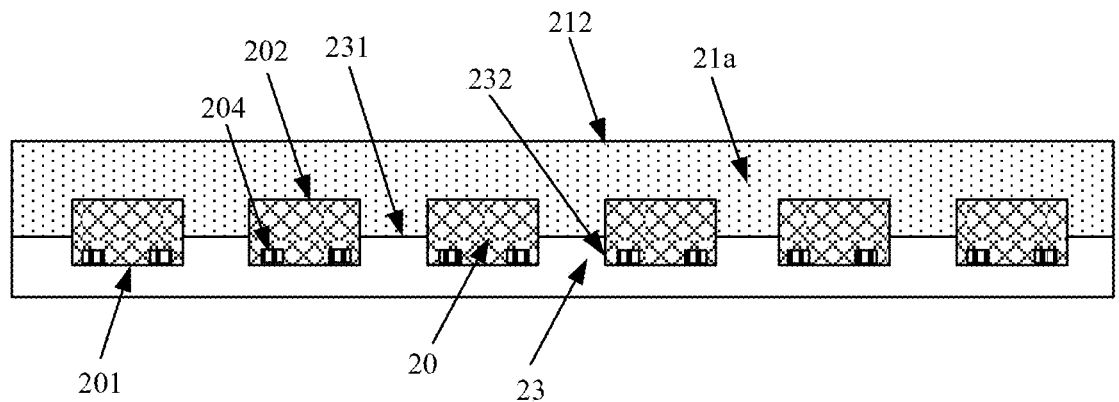

Firstly, as shown in FIG. 8, a first plastic packaging layer 21a is formed. The first plastic packaging layer 21a covers the to-be-packaged chips 20 and the temporary bonding surface 231 of the carrier plate 23. A surface of the first plastic packaging layer 21a facing away from the to-be-packaged chips 20 serves as the second surface 212.

Figure 9:
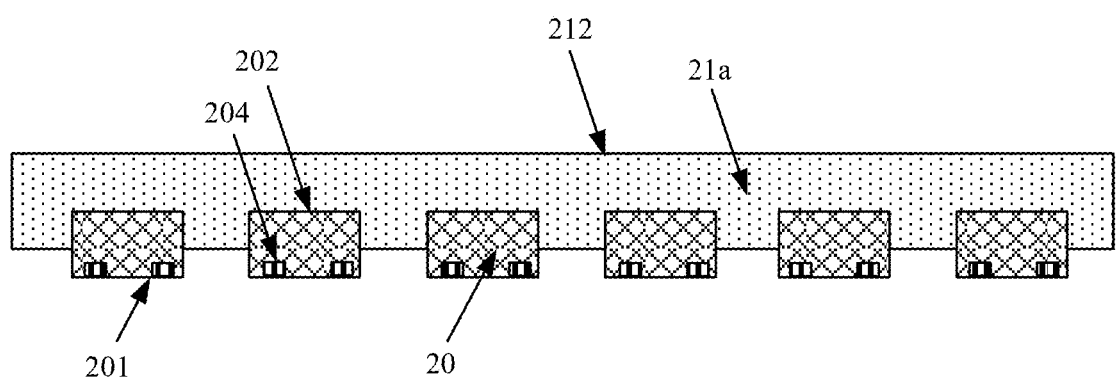

Next, as shown in FIG. 9, the carrier plate 23 is removed.

Figure 10:
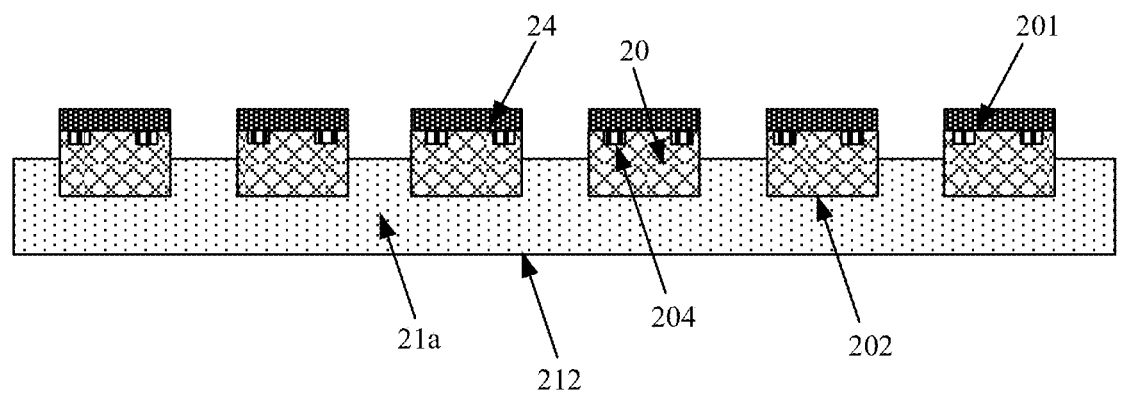
Figure 11:
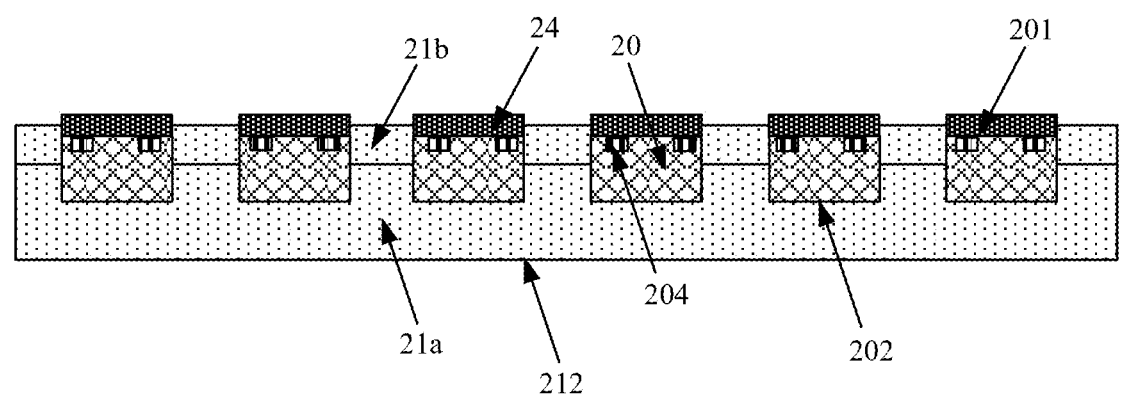
Figure 12:
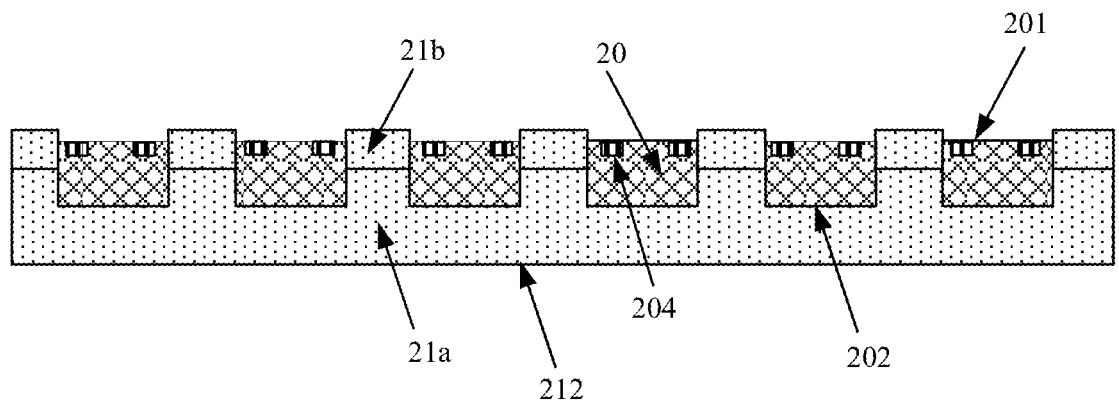
Figure 13:
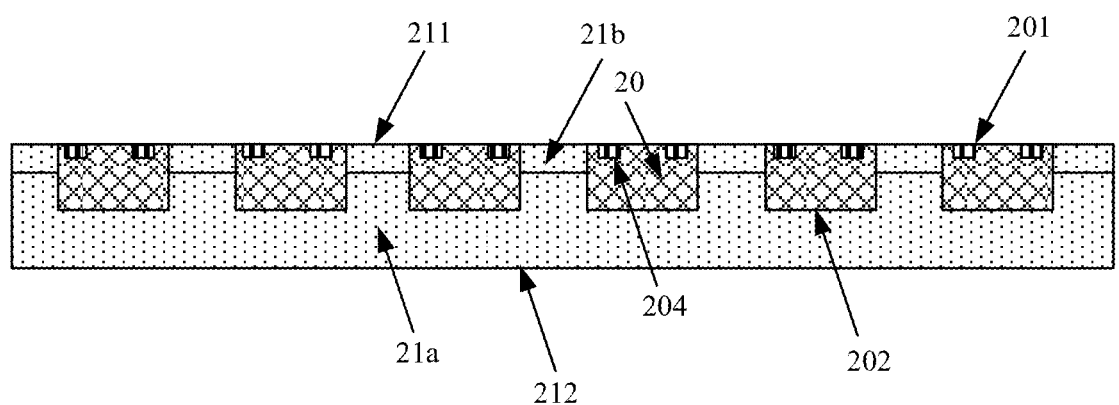

Next, as shown in FIGS. 10 to 13, a second plastic packaging layer 21b is formed on a surface of the first plastic packaging layer 21a exposing the front surfaces 201 of the to-be-packaged chips 20. A surface of the second plastic packaging layer 21b facing away from the first plastic packaging layer 21a serves as the first surface 211. In this embodiment, the forming a second plastic packaging layer 21b on a surface of the first plastic packaging layer 21a exposing the front surfaces 201 of the to-be-packaged chips 20 may be performed as follows. Firstly, as shown in FIG. 10, the front surfaces 201 of the to-be-packaged chips 20 face upward, and a protection layer 24 is formed on the front surfaces 201 of the to-be-packaged chips 20. Next, as shown in FIG. 11, the second plastic packaging layer 21b is formed. A thickness of the second plastic packaging layer 21b is greater than a height of a part of the to-be-packaged chip 20 outside of the first plastic packaging layer 21a. Next, as shown in FIG. 12, the protection layer 24 is removed. Finally, as shown in FIG. 13, the second plastic packaging layer 21b is thinned on a surface of the second plastic packaging layer 21b facing away from the first plastic packaging layer 21a, so that the surface of the second plastic packaging layer 21b facing away from the first plastic packaging layer 21a is flush with the front surfaces 201 of the to-be-packaged chips 20.

Figure 14:
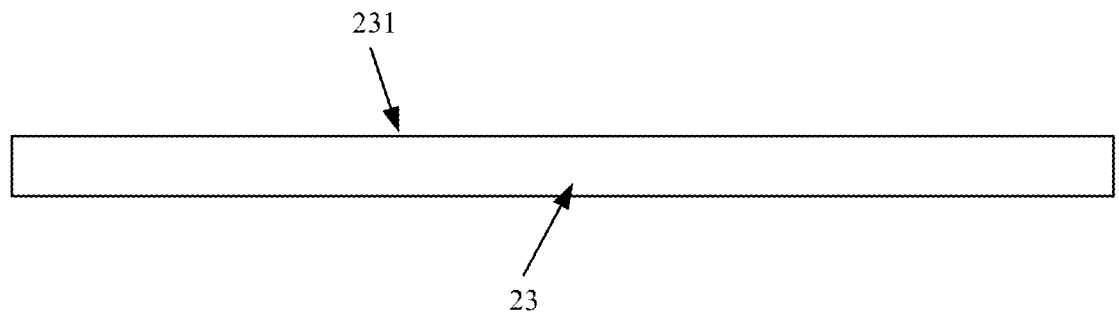
FIGS. 14 to 15 show a schematic flowchart of another method for forming a plastic packaging layer according to an embodiment of the present disclosure.
Figure 15:
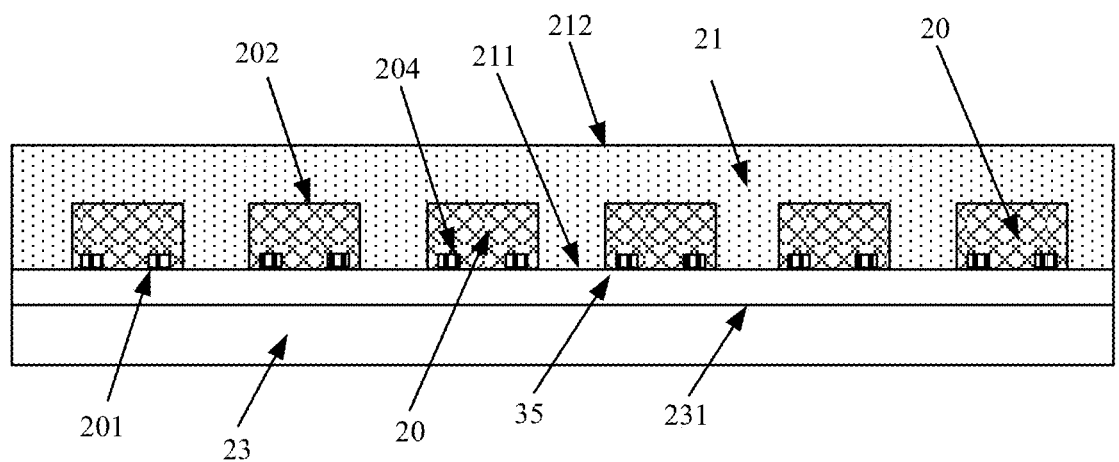

In the embodiment shown in FIGS. 6 to 13, the carrier plate 23 is provided with the mounting grooves 232. In another embodiment, a carrier plate 23 with a flat plate structure may also be directly used to form the plastic packaging layer 21, as shown in FIGS. 14 to 15, which show a schematic flowchart of another method for forming a plastic packaging layer according to an embodiment of the present disclosure. In this method, as shown in FIG. 14, the carrier plate 23 with a flat plate structure is used, and the temporary bonding surface 231 of the carrier plate 23 is a plane. In this case, as shown in FIG. 15, the attaching the front surfaces 201 of the to-be-packaged chips 20 to the temporary bonding surface 231 of the carrier plate 23 may be performed by attaching and fixing the to-be-packaged chips 20 to the temporary bonding surface 231 with a temporary adhesive film 35 having a uniform thickness. In this embodiment, the to-be-packaged chips 20 are collectively bonded and fixed on the temporary bonding surface 231 with a temporary adhesive film having a uniform thickness. Since the temporary bonding surface 231 is a plane, and the to-be-packaged chips 20 are bonded and fixed using a same layer of adhesive film 35, the front surfaces 201 of the to-be-packaged chips 20 can be located on a same surface.

In the case that the temporary bonding surface 231 is a plane, optionally, in the chip packaging method, the carrier plate 23 may be removed after the plastic packaging layer 21 is formed and before the interconnection structures 22 are formed. Alternatively, the carrier plate 23 may be removed after the interconnection structures 22 are formed and before the cutting process is performed.

In the above embodiment, the contact pad 204 of each of the to-be-packaged chips 20 is connected to the corresponding interconnection structure by a wire bonding process. Specifically, before the cutting process is performed, through holes 41 penetrating the first surface 211 and the second surface 212 of the plastic packaging layer 21 are formed. The through holes 41 may be formed by a laser drilling process. The contact pad 24 is connected to one end of a metal wire 42, and the other end of the metal wire 42 is connected to the interconnection structure 22 via the through hole 41. The through hole 41 is not overlapped with the to-be-packaged chip 20 in a first direction that is perpendicular to the first surface 211 and the second surface 212 of the plastic packaging layer 21.

Figure 16:
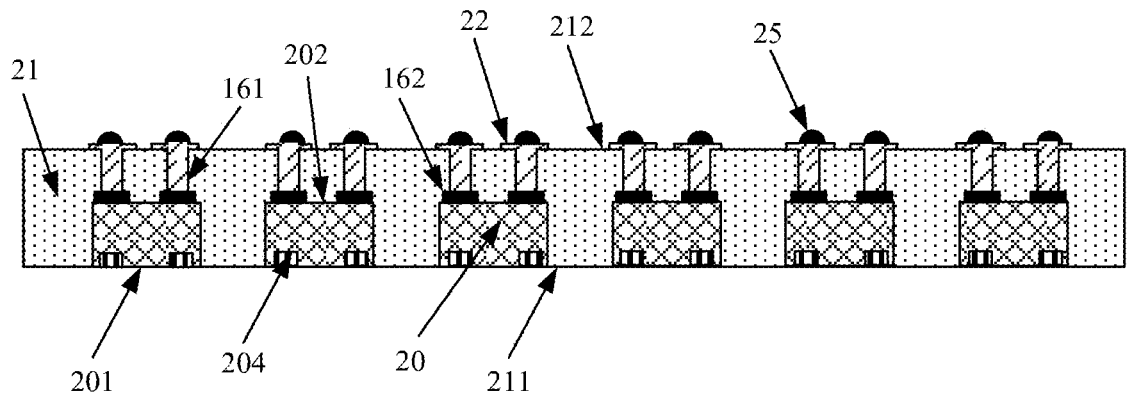
FIGS. 16 to 17 show a schematic flowchart of another chip packaging method according to an embodiment of the present disclosure.
Figure 17:
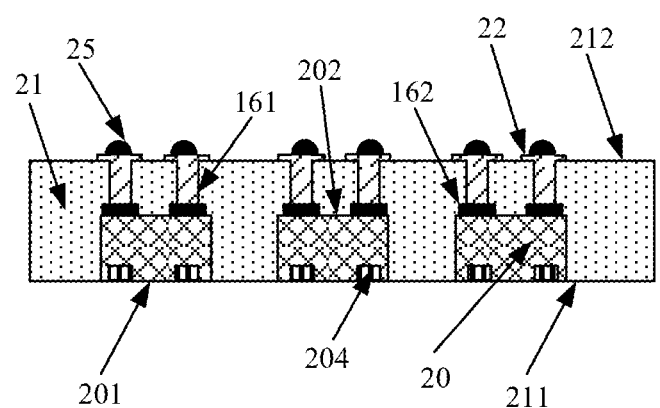

In another embodiment, the interconnection structure 22 may also be connected to a solder pad provided on the back surface of the to-be-packaged chip 20 directly via a through hole, and is further connected to the contact pad via the solder pad. Specifically, reference is made to FIGS. 16 to 17, which show a schematic flowchart of another chip packaging method according to an embodiment of the present disclosure. The back surface 202 of the to-be-packaged chip 20 is provided with a solder pad 162 connected to the contact pad 204. Before the metal wire layer is formed, through holes 161 are formed on the second surface 212 of the plastic packaging layer 21. The through holes 161 may be formed by a laser drilling process. The through hole 161 is directly opposite to the solder pad 162 in a first direction to expose the solder pad 162. The interconnecting structure 22 is connected to the solder pad 162 via the through hole 161. The first direction is perpendicular to the first surface 211 and the second surface 212 of the plastic packaging layer 21. In this embodiment, it is required to form a back interconnection structure (which is not shown in FIGS. 16 to 17) on the back surface of the to-be-packaged chip 20 by a through-silicon-via (TSV) process. In this case, the back surface 202 of the to-be-packaged chip 20 has a through hole that exposes the contact pad located on the front surface 201 of the to-be-packaged chip 20, so that the solder pad 162 can be connected to the contact pad 204 via the back interconnection structure. In this embodiment, the package formed after the cutting process is shown in FIG. 17. As described above, the number of to-be-packaged chips 20 in the package formed after the cutting process is not limited and may be one or more.

The back interconnection structure includes an insulating layer, a rewiring layer and a solder mask. The insulating layer covers the back surface 202 of the to-be-packaged chip 20 and sidewalls of the through hole, and a region of the insulating layer corresponding to the bottom of the through hole is provided with an opening to expose the contact pad. The rewiring layer covers the insulating layer and the bottom of the through hole. The solder mask covers the rewiring layer, and a region of the solder mask outside the through hole is provided with an opening exposing the rewiring layer. The opening is configured to receive the solder pad 162. The specific level and structure of the back interconnection structure are not shown in FIG. 16, and the back interconnection structure may be formed by the TSV process for a conventional chip, which is not described in detail herein. In this embodiment, each interconnection structure 22 is connected to the solder pad 162 located on the back surface 202 of the corresponding to-be-packaged chip 20 via at least one through hole 161. Each through hole 161 corresponds to one solder pad 162.

Figure 18:
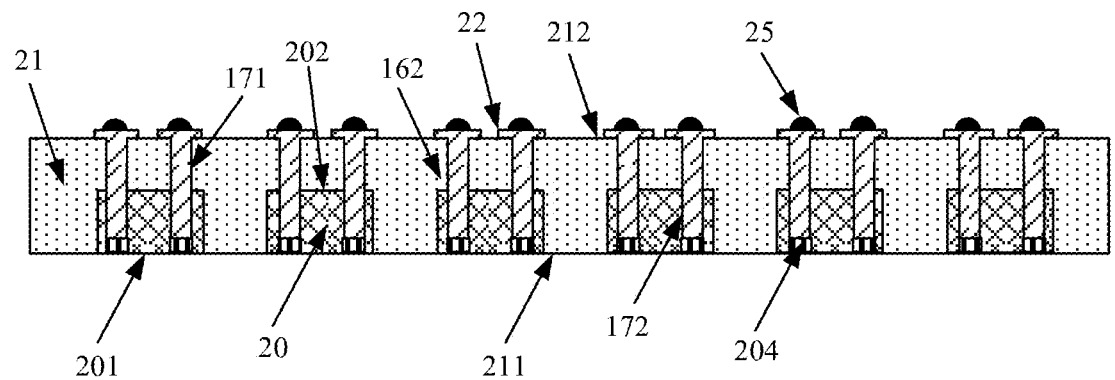
FIGS. 18 to 19 show a schematic flowchart of another chip packaging method according to an embodiment of the present disclosure.
Figure 19:
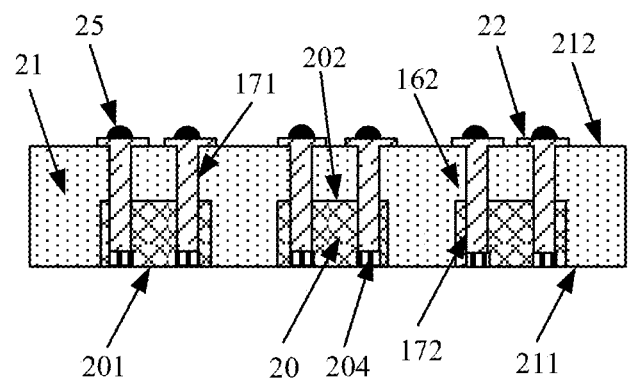

In another embodiment, the interconnection structure may also be connected to the contact pad via a first through hole penetrating the plastic packaging layer 21 and a second through hole penetrating the chip. Specifically, reference is made to FIGS. 18 to 19, which show a schematic flowchart of another chip packaging method according to an embodiment of the present disclosure. Before the metal wire layer is formed, first through holes 171 penetrating the plastic packaging layer 21 are formed. Second through holes 172 penetrating the front surfaces 201 and the back surfaces 202 of the to-be-packaged chips 20 are formed in the first through holes 171. The second through hole 172 is directly opposite to the contact pad in a first direction to expose the contact pad. The metal wire layer is connected to the contact pad via the first through hole 171 and the second through hole 172. The first direction is perpendicular to the first surface 211 and the second surface 212 of the plastic packaging layer 21. In order to avoid a short circuit between the interconnection structure 22 and a substrate of the to-be-packaged chip 20, an insulating layer covering sidewalls of the second through hole 172 is formed before the interconnection structure 22 is formed. The insulating layer exposes the contact pad at the bottom of the second through hole 172. The insulating layer may also cover sidewalls of the first through hole 171 and the second surface 212. In this embodiment, the package formed after the cutting process is shown in FIG. 19.

In this embodiment, the first through holes 171 are in a one-to-one correspondence with the second through holes 172, and the second through holes 172 are formed by using the plastic packaging layer 21 as a mask. In this embodiment, it is not required to form the back interconnection structure on the back surface of the to-be-packaged chip 20 by the TSV process, which simplifies the manufacturing process and reduces the cost. In addition, it is not required to perform wire bonding process, which reduces an area of the package.

In the packaging method according to the embodiment of the present disclosure, the to-be-packaged chip 20 is an image sensing chip. After the cutting process is completed, the chip packaging method further includes: fixing a bracket on the periphery of the first surface of the plastic packaging layer by using the plastic packaging layer 21 of the package as a substrate; and providing a transparent cover plate on the bracket, where the transparent cover plate may be a lens. Since the front surfaces 201 of the to-be-packaged chips 20 are located on a same plane, no height tolerance is generated between the to-be-packaged chips 20 and the transparent cover plate when the transparent cover plate is provided. In a case that the package includes one to-be-packaged chip, the transparent cover plate individually corresponds to the one to-be-packaged chip. Further, in a case that the package includes multiple to-be-packaged chips, the transparent cover plate corresponds to the multiple to-be-packaged chips.

In the chip packaging method according to the embodiment of the present disclosure, multiple to-be-packaged chips 20 are located on a same plastic packaging layer 21, and the front surfaces of the to-be-packaged chips 20 are flush with the first surface 211 of the plastic packaging layer 21, so that the plastic packaging layer 21 may be formed by a predetermined carrier plate 23. In this way, the first surface 211 of the plastic packaging layer 21 has good smoothness, and the front surfaces 201 of the to-be-packaged chips 20 can be located in the same plane, which ensures that the front surfaces 201 of multiple to-be-packaged chips 20 in a same package are flush with each other, and ensures the reliability of the package. Since the plastic packaging material for manufacturing the plastic packaging layer 21 has large hardness after a curing process, the plastic packaging layer 21 not only can package and protect the to-be-packaged chips 20, but also can serve as a substrate, on which other supporting components such as a bracket for supporting a transparent cover plate may be provided.

Based on the above packaging method, a chip package is provided according to another embodiment of the present disclosure. The chip package includes a plastic packaging layer, at least one to-be-packaged chip in the plastic packaging layer and an interconnection structure. The plastic packaging layer includes a first surface and a second surface opposite to each other. The to-be-packaged chip includes a front surface and a back surface opposite to each other, and the front surface of the to-be-packaged chip is provided with a sensing unit and contact pads connected to the sensing unit, and the front surface of the to-be-packaged chip is flush with the first surface. The interconnection structure is corresponding to the to-be-packaged chip and is provided on the second surface of plastic packaging layer. The contact pad is connected to an external circuit via the interconnection structure.

Figure 20:
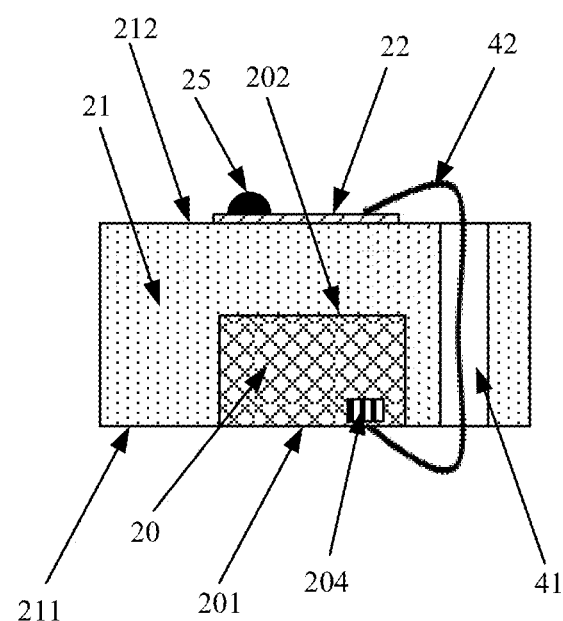
FIG. 20 is a schematic diagram of a package according to an embodiment of the present disclosure.

In a case that the package includes one to-be-packaged chip, the package is shown in FIG. 20, which is a schematic diagram of a package according to an embodiment of the present disclosure. A to-be-packaged chip 20 is located in a plastic packaging layer 21. The to-be-packaged chip 20 includes a front surface 201 and a back surface 202. The front surface 201 is provided with contact pads 204 and a sensing unit (which is not shown in FIG. 20). The to-be-packaged chip 20 is the same as those of the above embodiments, which is not repeated herein. The plastic packaging layer includes a first surface 211 and a second surface 212. The second surface 212 is provided with an interconnection structure 22 corresponding to the to-be-packaged chip 20. The plastic packaging layer 21 is provided with a through hole 41. A metal wire 42 is provided in the through hole 41, to connect the interconnection structure 22 and the contact pad 204. The interconnection structure 22 and the contact pad 204 may also be connected in other manners, including but not limited to manners in the above embodiment.

In the package according to the embodiment of the present disclosure, in a case that the package includes multiple to-be-packaged chips, the multiple to-be-packaged chips are located in the plastic packaging layer, and front surfaces of the to-be-packaged chips are located on a same plane and are flush with the first surface. Each of the to-be-packaged chips corresponds to one interconnection structure. In this case, the package is shown in FIG. 21.

Figure 21:
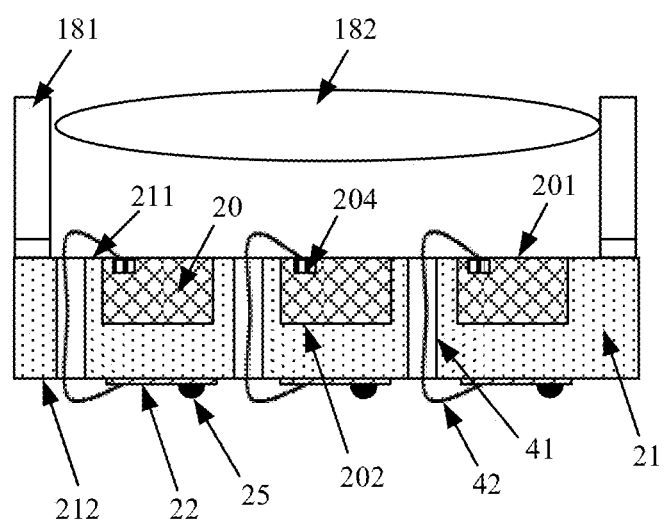
FIG. 21 is a schematic diagram of another package according to an embodiment of the present disclosure.

Reference is made to FIG. 21, which is a schematic diagram of another package according to an embodiment of the present disclosure. The package includes a plastic packaging layer 21, and multiple to-be-packaged chips 20 in the plastic packaging layer 21. The plastic packaging layer 21 includes a first surface 211 and a second surface 212 opposite to each other. Each of the multiple to-be-packaged chips 20 includes a front surface 201 and a back surface 202 opposite to each other, and the front surface 201 is provided with a sensing unit and contact pads connected to the sensing unit. The front surfaces 201 of the to-be-packaged chips 20 are located on a same plane and are flush with the first surface 211. The package further includes multiple interconnection structures 22 located on the second surface 212 of the plastic packaging layer 21. The multiple interconnection structures 22 are in a one-to-one correspondence with the to-be-packaged chips 20. The contact pad is connected to an external circuit via the interconnection structure 22. The to-be-packaged chip 20 is the same as those of the above embodiments, which is not repeated herein.

In an implementation, the plastic packaging layer 21 includes a first plastic packaging layer and a second plastic packaging layer. The first plastic packaging layer is provided with multiple grooves in a one-to-one correspondence with the to-be-packaged chips, and a depth of the groove is less than a thickness of the to-be-packaged chip. The back surfaces of the to-be-packaged chips are directly opposite to bottoms of the grooves. A surface of the first plastic packaging layer facing away from the to-be-packaged chips serves as the second surface. The second plastic packaging layer covers a surface of the first plastic packaging layer facing towards the to-be-packaged chips, and a surface of the second plastic packaging layer facing away from the first plastic packaging layer serves as the first surface. In another implementation, the plastic packaging layer 21 has a single-layer structure formed by a carrier plate with a plate structure. For specific structures and forming processes in the two implementations, reference may be made to the above embodiments, which are not repeated herein.

In the package according to the embodiment of the present disclosure, the interconnection structures 22 are located on a same patterned metal wire layer. Solder bumps 25 are formed on surfaces of the interconnection structures 22. The solder bumps 25 are connected to the external circuit. The contact pad on the front surface 201 of the to-be-packaged chip 20 is connected to the interconnection structure 22 and is further connected to the external circuit via the solder bump 25. Optionally, an insulating protection layer is provided on the surfaces of the interconnection structures 22, and a surface of the insulating protection layer is provided with openings for receiving the solder bumps 25. The insulating protection layer is not shown in FIG. 21.

In the embodiment shown in FIG. 21, the plastic packaging layer 21 is provided with through holes 41 penetrating the first surface 211 and the second surface 212. The contact pad is connected to one end of a metal wire 42, and the other end of the metal wire 42 is connected to the interconnection structure 22 via the through hole 41. The through hole 41 is not overlapped with the to-be-packaged chip 20 in a first direction that is perpendicular to the first surface 211 and the second surface 212 of the plastic packaging layer 21.

Optionally, the to-be-packaged chip 20 is an image sensing chip. The first surface 211 of the plastic packaging layer 21 is further provided with a bracket 181. A transparent cover plate 182 is installed on the bracket 181. The transparent cover plate may be a transparent lens for regulating light emitted or collected by the image sensing chip.

As described in the above embodiment, in another implementation, the back surface 202 of each of the to-be-packaged chips 20 is provided with a solder pad connected to the contact pad. The second surface 212 of the plastic packaging layer 21 is provided with through holes. The through hole is directly opposite to the solder pad in the first direction to expose the solder pad. The interconnection structure is connected to the solder pad via the through hole. The package formed in this manner is the same as that in FIG. 17, which is not repeated herein. For the electrical connection structure, reference may be made to corresponding implementations in the above packaging method, which is not repeated herein.

As described in the above embodiment, in another implementation, the plastic packaging layer 21 is provided with first through holes. The back surfaces 202 of the to-be-packaged chips 20 are provided with second through holes in a one-to-one correspondence with the first through holes. The second through hole is directly opposite to the contact pad in the first direction to expose the contact pad. The metal wire layer is connected to the contact pad via the first through hole and the second through hole. The package formed in this manner is the same as that in FIG. 19, which is not repeated herein. For the electrical connection structure, reference may be made to corresponding implementations in the above packaging method, which is not repeated herein.

It can be known from the above description that, in the package according to the embodiment of the present disclosure, multiple to-be-packaged chips 20 are located on a same plastic packaging layer 21, and the front surfaces of the to-be-packaged chips 20 are flush with the first surface 211 of the plastic packaging layer 21, so that the plastic packaging layer 21 may be formed by a predetermined carrier plate 23. In this way, the first surface 211 of the plastic packaging layer 21 has good smoothness, and the front surfaces 201 of the to-be-packaged chips 20 can be located in the same plane, which ensures that the front surfaces 201 of multiple to-be-packaged chips 20 in a same package are flush with each other, and ensures the reliability of the package. Since the plastic packaging material for manufacturing the plastic packaging layer 21 has large hardness after a curing process, the plastic packaging layer 21 not only can package and protect the to-be-packaged chips 20, but also can serve as a substrate on which other supporting components such as a bracket for supporting a transparent cover plate may be provided.

Embodiments in this specification are described in a progressive manner, each of the embodiments emphasizes differences from other embodiments, and the same or similar parts among the embodiments can be referred to each other. For the package disclosed in the embodiments, since the package corresponds to the packaging method disclosed in the embodiments, the description is relatively simple, and for the related parts, one may refer to the description of the package method.

Based on the above description of the disclosed embodiments, those skilled in the art can implement or carry out the present disclosure. It is obvious for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A chip packaging method, comprising:
providing at least one to-be-packaged chip, wherein the to-be-packaged chip comprises a front surface and a back surface opposite to each other, and the front surface of the to-be-packaged chip is provided with a sensing unit and contact pads connected to the sensing unit;
forming a plastic packaging layer covering the back surface of the to-be-packaged chip, wherein the plastic packaging layer comprises a first surface and a second surface opposite to each other, the to-be-packaged chip is located in the plastic packaging layer, and the front surface of the to-be-packaged chip is flush with the first surface; and
forming an interconnection structure corresponding to the to-be-packaged chip on the second surface of the plastic packaging layer, wherein
the contact pad is connected to an external circuit via the interconnection structures;
wherein a plurality of to-be-packaged chips are provided in the plastic packaging layer, front surfaces of the to-be-packaged chips are located on a same plane and are flush with the first surface, and a plurality of interconnection structures in a one-to-one correspondence with the to-be-packaged chips are formed.

2. The chip packaging method according to claim 1, wherein the chip packaging method further comprises:
dividing the plastic packaging layer into a plurality of packages by a cutting process, wherein each of the packages comprises at least one of the to-be-packaged chips and the interconnection structure corresponding to the at least one of the to-be-packaged chips.

3. The chip packaging method according to claim 2, wherein forming the plastic packaging layer covering the back surfaces of the to-be-packaged chips comprises:
providing a carrier plate having a temporary bonding surface for mounting the to-be-packaged chips;
attaching the front surfaces of the to-be-packaged chips to the temporary bonding surface of the carrier plate; and
forming the plastic packaging layer, wherein the plastic packaging layer covers the to-be-packaged chips and the temporary bonding surface of the carrier plate.

4. The chip packaging method according to claim 3, wherein
the temporary bonding surface of the carrier plate is provided with a plurality of mounting grooves, each of the mounting grooves is configured to receive one of the to-be-packaged chips, there is a gap between two adjacent mounting grooves, and the mounting grooves have a same depth less than a thickness of the to-be-packaged chip, and
the attaching the front surfaces of the to-be-packaged chips to the temporary bonding surface of the carrier plate comprises: placing one of the to-be-packaged chips in each of the mounting grooves, with the front surfaces of the to-be-packaged chips being opposite to bottoms of the mounting grooves.

5. The chip packaging method according to claim 4, wherein the forming the plastic packaging layer comprises:
forming a first plastic packaging layer, wherein the first plastic packaging layer covers the to-be-packaged chips and the temporary bonding surface of the carrier plate, and a surface of the first plastic packaging layer facing away from the to-be-packaged chips serves as the second surface;
removing the carrier plate; and
forming a second plastic packaging layer on a surface of the first plastic packaging layer exposing the front surfaces of the to-be-packaged chips, wherein a surface of the second plastic packaging layer facing away from the first plastic packaging layer serves as the first surface.

6. The chip packaging method according to claim 5, wherein the forming a second plastic packaging layer on a surface of the first plastic packaging layer exposing the front surfaces of the to-be-packaged chips comprises:
forming a protection layer on the front surfaces of the to-be-packaged chips;
forming the second plastic packaging layer, wherein a thickness of the second plastic packaging layer is greater than a height of a part of the to-be-packaged chip outside of the first plastic packaging layer;
removing the protection layer; and
thinning the second plastic packaging layer on a surface of the second plastic packaging layer facing away from the first plastic packaging layer, to cause the surface of the second plastic packaging layer facing away from the first plastic packaging layer to be flush with the front surfaces of the to-be-packaged chips.

7. The chip packaging method according to claim 3, wherein
the temporary bonding surface is a plane; and
the attaching the front surfaces of the to-be-packaged chips to the temporary bonding surface of the carrier plate comprises: attaching and fixing the to-be-packaged chips to the temporary bonding surface with a temporary adhesive film having a uniform thickness.

8. The chip packaging method according to claim 7, further comprising:
removing the carrier plate after forming the plastic packaging layer and before forming the interconnection structures; or
removing the carrier plate after forming the interconnection structures and before performing the cutting process.

9. The chip packaging method according to claim 2, wherein forming interconnection structures corresponding to the to-be-packaged chips on the second surface of the plastic packaging layer comprises:
forming a patterned metal wire layer on the second surface of the plastic packaging layer, wherein the metal wire layer comprises the plurality of interconnection structures in a one-to-one correspondence with the to-be-packaged chips, and wherein solder bumps are formed on surfaces of the interconnection structures, and the solder bumps are connected to the external circuit.

10. The chip packaging method according to claim 9, wherein the forming a patterned metal wire layer on the second surface of the plastic packaging layer comprises:
forming a metal wire layer covering the second surface of the plastic packaging layer; and
etching and patterning the metal wire layer, to form the plurality of interconnection structures in a one-to-one correspondence with the to-be-packaged chips.

11. The chip packaging method according to claim 9, wherein the forming a patterned metal wire layer on the second surface of the plastic packaging layer comprises:
forming the patterned metal wire layer with a mask having a predetermined pattern structure by an evaporation process.

12. The chip packaging method according to claim 9, wherein before performing the cutting process, the chip packaging method further comprises:
forming through holes penetrating the first surface and the second surface of the plastic packaging layer; and
connecting the contact pad to one end of a metal wire, and connecting the other end of the metal wire to the interconnection structure via the through hole, wherein the through hole is not overlapped with the to-be-packaged chip in a first direction that is perpendicular to the first surface and the second surface of the plastic packaging layer.

13. The chip packaging method according to claim 9, wherein the back surface of each of the to-be-packaged chips is provided with a solder pad connected to the contact pad, and wherein before forming the metal wire layer, the chip packaging method further comprises:
forming through holes on the second surface of the plastic packaging layer, with the through hole being directly opposite to the solder pad in a first direction to expose the solder pad, wherein
the interconnection structure is connected to the solder pad via the through hole; and
the first direction is perpendicular to the first surface and the second surface of the plastic packaging layer.

14. The chip packaging method according to claim 9, wherein before forming the metal wire layer, the chip packaging method further comprises:
forming first through holes penetrating the plastic packaging layer; and
forming second through holes penetrating the front surfaces and the back surfaces of the to-be-packaged chips in the first through holes, with the second through hole being directly opposite to the contact pad in a first direction to expose the contact pad, wherein
the metal wire layer is connected to the contact pad via the first through hole and the second through hole, and the first direction is perpendicular to the first surface and the second surface of the plastic packaging layer.

15. The chip packaging method according to claim 9, wherein before performing the cutting process, the chip packaging method further comprises:
forming an insulating protection layer covering the metal wire layer, wherein a surface of the insulating protection layer is provided with openings for receiving the solder bumps.

16. The chip packaging method according to claim 1, wherein the to-be-packaged chip is an image sensing chip, and wherein after completing a cutting process, the chip packaging method further comprises:
fixing a bracket on the periphery of the first surface of the plastic packaging layer by using the plastic packaging layer of a package as a substrate; and
providing a transparent cover plate on the bracket.

17. A chip package, comprising:
a plastic packaging layer, wherein the plastic packaging layer comprises a first surface and a second surface opposite to each other;
at least one to-be-packaged chip in the plastic packaging layer, wherein the to-be-packaged chip comprises a front surface and a back surface opposite to each other, the front surface of the to-be-packaged chip is provided with a sensing unit and contact pads connected to the sensing unit, and the front surface of the to-be-packaged chip is flush with the first surface; and
an interconnection structure corresponding to the to-be-packaged chip and provided on the second surface of the plastic packaging layer, wherein
the contact pad is connected to an external circuit via the interconnection structure,
wherein a plurality of to-be-packaged chips are provided in the plastic packaging layer, wherein front surfaces of the to-be-packaged chips are located on a same plane and are flush with the first surface, wherein a plurality of interconnection structures in a one-to-one correspondence with the to-be-packaged chips are formed.

18. The chip package according to claim 17, wherein the plastic packaging layer comprises:
a first plastic packaging layer, wherein the first plastic packaging layer is provided with a plurality of grooves in a one-to-one correspondence with the to-be-packaged chips, a depth of the groove is less than a thickness of the to-be-packaged chip, and the back surfaces of the to-be-packaged chips are directly opposite to bottoms of the grooves, wherein a surface of the first plastic packaging layer facing away from the to-be-packaged chips serves as the second surface; and
a second plastic packaging layer, wherein the second plastic packaging layer covers a surface of the first plastic packaging layer facing towards the to-be-packaged chips, and a surface of the second plastic packaging layer facing away from the first plastic packaging layer serves as the first surface.

19. The chip package according to claim 17, wherein
the interconnection structures are located on a same patterned metal wire layer; and
solder bumps are formed on surfaces of the interconnection structures, and the solder bumps are connected to the external circuit.

20. The chip package according to claim 19, wherein
the plastic packaging layer is provided with through holes penetrating the first surface and the second surface;
the contact pad is connected to one end of a metal wire, and the other end of the metal wire is connected to the interconnection structure via the through hole; and the through hole is not overlapped with the to-be-packaged chip in a first direction that is perpendicular to the first surface and the second surface of the plastic packaging layer.

21. The chip package according to claim 19, wherein
the back surface of each of the to-be-packaged chips is provided with a solder pad connected to the contact pad;
the second surface of the plastic packaging layer is provided with through holes, with the through hole being directly opposite to the solder pad in a first direction to expose the solder pad, wherein the first direction is perpendicular to the first surface and the second surface of the plastic packaging layer; and
the interconnection structure is connected to the solder pad via the through hole.

22. The chip package according to claim 19, wherein
the plastic packaging layer is provided with first through holes;
the back surfaces of the to-be-packaged chips are provided with second through holes in a one-to-one correspondence with the first through holes, with the second through hole being directly opposite to the contact pad in a first direction to expose the contact pad; and
the metal wire layer is connected to the contact pad via the first through hole and the second through hole, and the first direction is perpendicular to the first surface and the second surface of the plastic packaging layer.

23. The chip package according to claim 19, wherein an insulating protection layer is provided on the surfaces of the interconnection structures, and a surface of the insulating protection layer is provided with openings for receiving the solder bumps.

24. The chip package according to claim 23, wherein
the first surface of the plastic packaging layer is further provided with a bracket; and
a transparent cover plate is installed on the bracket.

25. The chip package according to claim 17, wherein the to-be-packaged chip is an image sensing chip.

* * * * *